US012399231B2

(12) United States Patent
Sengodan et al.

(10) Patent No.: US 12,399,231 B2
(45) Date of Patent: Aug. 26, 2025

(54) FAULT DETECTION METHOD AND SYSTEM THEREFOR

(71) Applicant: Hamilton Sundstrand Corporation, Charlotte, NC (US)

(72) Inventors: Rajkumar Sengodan, Namakkal (IN); Saravanan Munusamy, Chengalpattu (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 311 days.

(21) Appl. No.: 18/093,706

(22) Filed: Jan. 5, 2023

(65) Prior Publication Data

US 2023/0221381 A1 Jul. 13, 2023

(30) Foreign Application Priority Data

Jan. 8, 2022 (IN) .............................. 202241001130

(51) Int. Cl.
*H02H 3/20* (2006.01)
*G01R 31/52* (2020.01)

(52) U.S. Cl.
CPC .............. *G01R 31/52* (2020.01); *H02H 3/20* (2013.01)

(58) Field of Classification Search
CPC ...... G01R 31/008; G01R 31/42; G01R 31/52; G01R 19/16538; G01R 19/16557; H02M 1/32; H02M 1/325; H02M 5/458; H02M 7/06; H02M 7/44; H02M 7/217
USPC ............................... 361/91.1, 93.1, 100–103
See application file for complete search history.

(56) References Cited

U.S. PATENT DOCUMENTS

| | | | |
|---|---|---|---|
| 6,362,982 B1 | 3/2002 | Despatie et al. | |
| 6,538,910 B1 | 3/2003 | Spitz et al. | |
| 7,236,380 B1 | 6/2007 | Spitz et al. | |
| 9,036,382 B2* | 5/2015 | Li | H02H 7/1216 361/85 |
| 9,705,440 B2 | 7/2017 | Rozman et al. | |
| 2009/0168469 A1 | 7/2009 | Dishman et al. | |
| 2014/0254217 A1* | 9/2014 | Li | H02M 1/32 324/76.52 |
| 2015/0244165 A1* | 8/2015 | Roesner | H02H 3/087 361/79 |
| 2015/0311696 A1* | 10/2015 | Zhu | H02H 3/207 361/21 |
| 2015/0357813 A1 | 12/2015 | Wu et al. | |
| 2016/0285381 A1* | 9/2016 | Lai | G01R 31/42 |
| 2017/0222571 A1 | 8/2017 | Gonzalez-Espin et al. | |

(Continued)

FOREIGN PATENT DOCUMENTS

| | | |
|---|---|---|
| EP | 2162891 A1 | 3/2010 |
| EP | 2383581 A1 | 11/2011 |
| EP | 3016261 A1 | 5/2016 |

OTHER PUBLICATIONS

Extended European Search Report issued in EP Patent Application No. 23150208.9 on Jun. 16, 2023.

*Primary Examiner* — Tuan T Dinh

(57) ABSTRACT

Fault detection system and method each includes a positive input line configured to connect between a voltage input and a load and a negative input line configured to connect between the voltage input and the load. A logic module is operatively connected to and/or configured to detect a fault (e.g., a short circuit) in either of the positive input line or the negative input line between the voltage input and the load.

20 Claims, 2 Drawing Sheets

(56) References Cited

U.S. PATENT DOCUMENTS

| | | | |
|---|---|---|---|
| 2017/0244314 A1* | 8/2017 | Lee | H02M 7/44 |
| 2017/0373630 A1 | 12/2017 | Figie et al. | |
| 2019/0207375 A1* | 7/2019 | Telefus | H02M 7/217 |
| 2020/0106260 A1* | 4/2020 | Telefus | H03K 17/687 |

* cited by examiner

FAULT DETECTION METHOD AND SYSTEM THEREFOR

CROSS-REFERENCE TO RELATED APPLICATIONS

This application claims priority to and the benefit of Indian Patent Application No. IN202241001130 filed Jan. 8, 2022, the entire content of which is incorporated herein by reference.

TECHNICAL FIELD

The present disclosure relates to fault detection systems and methods.

BACKGROUND

Fault tolerant systems, and methods for detecting faults in such systems are desirable in many applications; for example, in aircraft. In typical systems, current limiting resistors are added to the alternating current inputs of rectifiers to protect the electronics against a rectifier diode fault. However, using current limiting resistors may result in distortion on the rectified output, which can be undesirable in certain applications. Another conventional method for detecting faults in rectifier diodes includes using Hall Effect sensors to detect a current at the rectifier input using the magnetic field measurement method and then generate an error signal. However, configuring the Hall Effect sensors on the diode path can be complex and expensive and may be limited due to space constraints.

There is always a need in the art for improvements to fault detection systems and methods. This disclosure provides a solution for this need using an improved detection method and control systems to allow for a fault tolerant system without current limiting resistors or Hall Effect sensors.

SUMMARY

In accordance with at least one aspect of this disclosure, a system includes, a positive input line configured to connect between a voltage input and a load, a negative input line configured to connect between the voltage input and the load, and a logic module configured to detect a fault in either of the positive input line or the negative input line between the voltage input and the load. In embodiments, the logic module includes a voltage bias input operatively connected to the positive input line configured to invert voltage from the positive input line if a fault has occurred. In embodiments, the logic module also includes a sensing network configured to sense a voltage of the positive and negative input lines at an input of the logic module. The sensing network can be configured to output a fault trigger to a control module to disconnect the voltage input from the positive input line and the negative input line if a fault is detected.

A rectifier can be disposed between the voltage input and the logic module, the rectifier including one or more rectifier diodes for one or more phases, arranged in parallel, where one diode is included for each phase, the one or more rectifier diodes configured to rectify the voltage input from AC to DC. In embodiments, the one or more diodes rectifier diodes can include three rectifier diodes, and the one or more phases includes three phases such that the system is configured for use with a three-phase rectifier. In certain embodiments, a converter can be disposed between the rectifier and the load.

A contactor block can be disposed between the voltage input and the rectifier and operatively connected to the control module, the contactor block comprising, one or more contactors for one or more phases, where one contactor is included for each phase, each contactor configured to move between an open state and a closed state. The control module can be configured to control a respective contactor to move to the open state if a fault has occurred.

In embodiments, the sensing network can be disposed at an input of the logic module. In certain embodiments, the sensing network can include one or more current sense resistors disposed in each of the positive and negative input lines, configured to sense a voltage drop across each of the positive input line and negative input line at the input of the logic module and operative to output a signal indicative of the sensed voltage drop in each of the positive and negative input lines. The sensing network can also include one or more comparators operatively connected to receive the signal indicative of the voltage drop in the positive and negative input lines, compare the sensed voltage drop to a reference voltage, and output a respective fault trigger signal if the sensed voltage drop is greater than the reference voltage. In embodiments, the sensing network can include one or more logic gates operatively connected to receive the respective fault trigger signal and output a respective gate signal to a flip-flop.

In embodiments, the least one logic gate can include the flip-flop, where the flip-flop includes an RS flip-flop, a first NOT gate disposed in the positive line configured to invert the respective fault trigger signal from the positive input line, an OR gate configured to OR the respective fault trigger signals and output the ORed signal to an R and S input of the flip-flop, and a second NOT gate disposed between the OR gate and the flip-flop configured to invert the ORed signal at the R input of the flip-flop.

In certain embodiments, the sensing network can further include one or more protection diodes, operatively connected between each of the positive and negative lines and ground. In certain embodiments, the one or more protection diodes can include at least one of a Zener diode and/or a Schottky diode. In embodiments, the Schottky diode is configured to clamp a negative peak in the positive input line during a fault if a sensed voltage in the positive line drops to 0V, and the Zener diode can be configured to clamp a maximum voltage of an input of the one or more comparators.

In embodiments, if the output of the flip-flop is HIGH, the fault trigger signal can be fed to the control module to control the contactor block to move the one or more contactors to the open state to disconnect the voltage input from the load. If the output of the flip-flop is LOW, no fault detection trigger is stored in the flip-flop or fed to the control module such that the one or more contactors in the contactor block remain in the closed state.

In certain embodiments, a full bridge reciter can be disposed between the voltage input and the logic module, the rectifier including one or more rectifier diode pairs for one or more phases, arranged in series, where one diode pair is included for each phase, each diode pair configured to rectify the voltage input from AC to DC. In certain embodiments, one or more fault detection diodes can be disposed between the rectifier and the logic module, configured to detect a fault in any one of the one or more rectifier diodes.

In certain such embodiments, the sensing network can be disposed between the one or more fault detection diodes and the logic module.

In accordance with at least one aspect of this disclosure, a method can include detecting a fault in one or more of a positive input line and/or a negative input line using one or more current sense resistors, outputting a fault trigger signal to a control module, and controlling, with the control module, a contactor block disposed between a voltage input and a load to disconnect the voltage input from the positive input line and negative input line based at least in part on the fault trigger signal. In embodiments, the method can further include, inverting a voltage from the positive input line if a fault has occurred using a voltage bias input operatively connected to the positive input line.

In embodiments, detecting can include sensing a voltage drop across each of the positive input line and the negative input line at an input of a logic module and outputting a signal indicative of the voltage drop in each of the positive and negative input lines. In embodiments, sensing can include, comparing the signal indicative of the voltage drop in each of the positive and negative input lines to a reference voltage and outputting a respective fault trigger signal for each of the positive and negative input lines if the sensed voltage drop is greater than the reference voltage.

In certain embodiments, detecting can include at least one of: inverting the respective fault trigger signal from the positive input line; ORing the respective fault trigger signals from each of the positive and negative lines and outputting the ORed signal to an R and S input of a flip-flop; and/or inverting the ORed signal at the R input of the flip-flop. In embodiments, outputting can include, outputting the fault trigger from the flip-flop to the control module.

In embodiments, controlling can include, if the output of the flip-flop is HIGH, controlling, with the control module, the contactor block to move one or more contactors to the open state to disconnect the voltage input from the load, and/or if the output of the flip-flop is LOW, controlling the contactor block, with the control module, to retain one or more contactors in the closed state to maintain electrical connection between the voltage input and the load.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
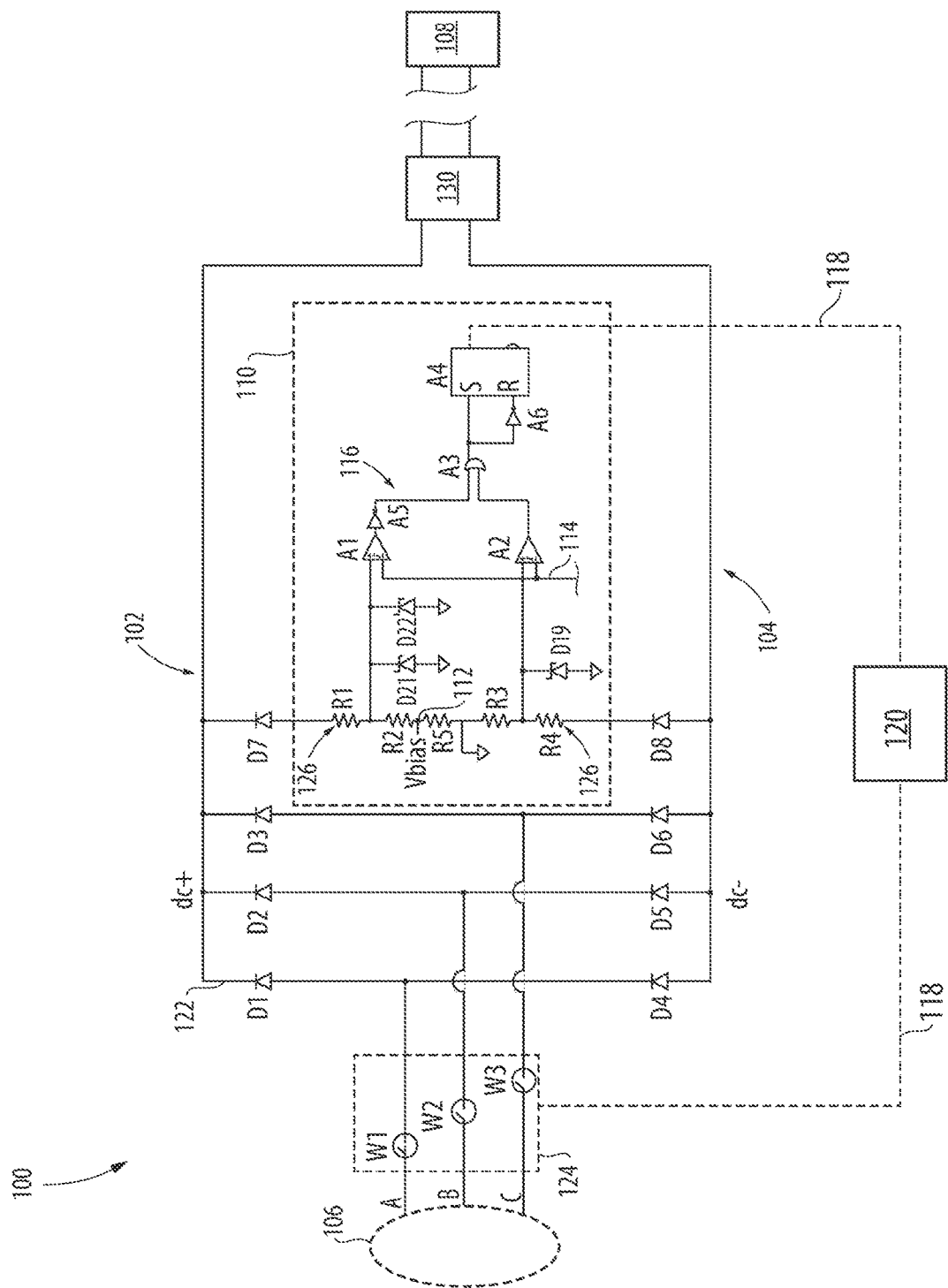
FIG. 1 is a schematic, circuit diagram in accordance with this disclosure, showing an embodiment of a fault detection system.
Figure 2:
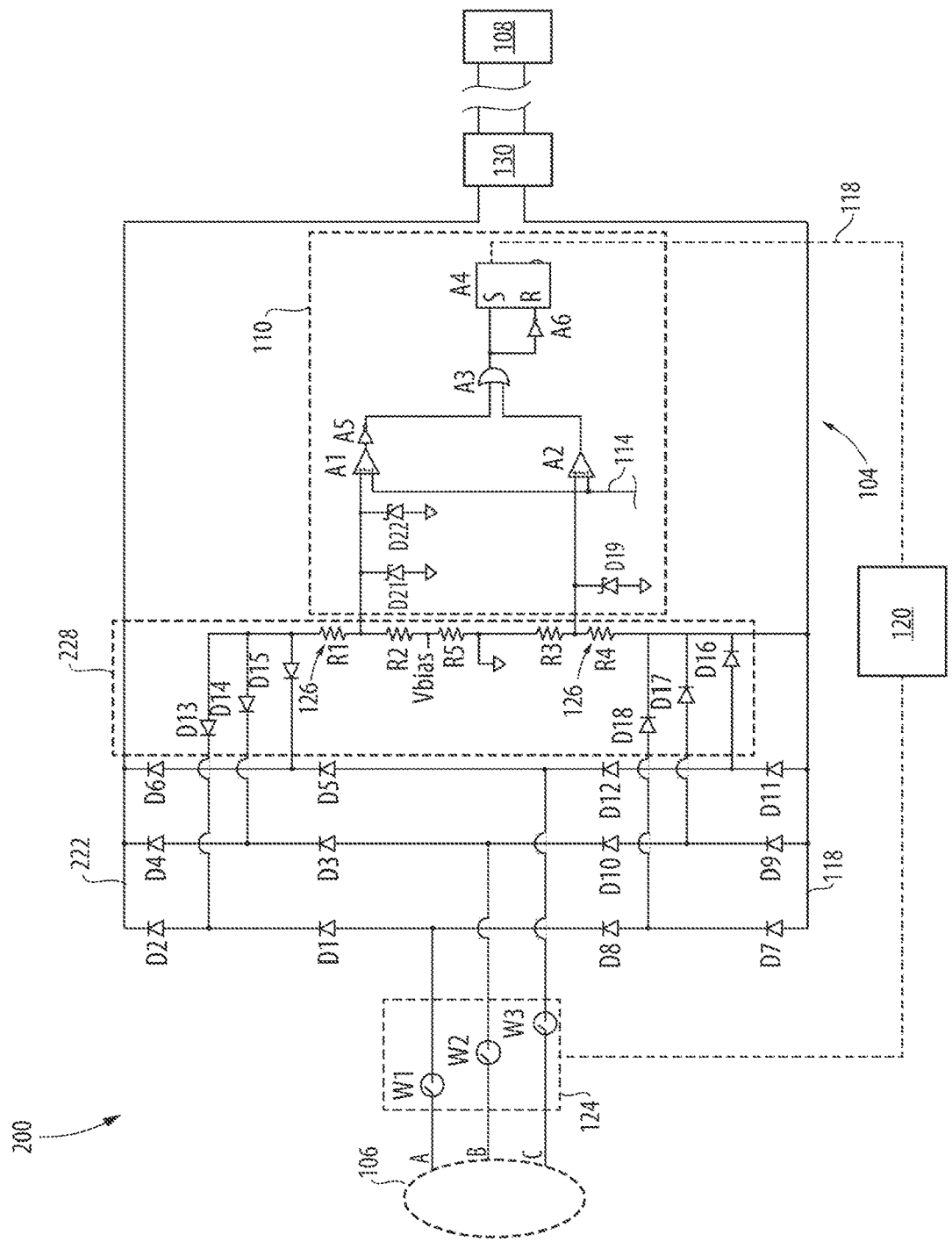
FIG. 2 is a schematic, circuit diagram in accordance with this disclosure, showing another embodiment of a fault detection system.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIG. 2.

In accordance with at least one aspect of this disclosure, a system 100 can include a positive input line 102 configured to connect between a voltage input 106 and a load 108, and a negative input line 104 configured to connect between the voltage input 106 and the load 108. A logic module 110 can be operatively connected to and/or configured to detect a fault (e.g., a short circuit) in either of the positive input line 102 or the negative input line 104 between the voltage input 106 and the load 108.

In embodiments, the logic module 110 can include, a voltage bias input 112 operatively connected to the positive input line 104 configured to invert voltage from the positive input line 104 if a fault has occurred. In embodiments, the voltage bias input 112 can help to utilize a single ended power supply for the logic module 110 and the voltage bias input 112 can be greater than a reference voltage 114. The logic module 110 can also include a sensing network 116 configured to sense a voltage of the positive and negative input lines 102, 104 at an input 126 of the logic module 110. The sensing network 116 can also be configured to output a fault trigger 118 to a control module 120 to disconnect the voltage input 106 from the positive input line 102 and the negative input line 104 if a fault is detected. In embodiments, the sensing network 116 can be disposed at the input 126 of the logic module 110.

A rectifier 122 can be disposed between the voltage input 106 and the logic module 110. The rectifier can include one or more rectifier diodes D1 to D6 for one or more phases A, B, C, where the rectifier diodes D1 to D6 are arranged in parallel. As shown, one diode can be included for each phase. In certain embodiments, such as shown, the one or more diodes rectifier diodes can include three rectifier diodes, and the one or more phases can include three phases such that the system is configured for use with a three-phase rectifier. The one or more rectifier diodes D1 to D6 can be configured to rectify the voltage input 106 from AC to DC. In certain instances, having more diodes per phase could require additional heat sinks, therefore fewer diodes may prove advantageous in an application where fewer heat sinks are required.

A contactor block 124 can be disposed between the voltage input 106 and the rectifier 122 and operatively connected to the control module 120, the contactor block 124 comprising, one or more contactors W1, W2, W3, for one or more phases, where one contactor is included for each phase. Each contactor can be configured to move between an open state (e.g., an OFF state as shown) and a closed state (e.g., an ON state). The control module 120 can be configured to control a respective contactor to move to the open state if a fault has occurred, thereby disconnecting the rectifier from the voltage input 106. In certain embodiments, the state of the contactors (e.g., ON or OFF) can be sensed manually or automatic by the control module 120, or a separate control module. In certain embodiments, a microprocessor can be included between the contactor block 124 and the logic module 110.

In embodiments, the sensing network 116 can include one or more current sense resistors R1 to R4 disposed in each of the positive and negative input lines 102, 104, configured to sense a voltage drop across each of the positive input line and negative input line 102, 104 at the input 126 of the logic module 110. The current sense resistors R1 to R4 can be operative to output a signal indicative of the sensed voltage drop in each of the positive and negative input lines 102, 104, for example to one or more comparators A1 and A2.

The one or more comparators A1, A2 can be operatively connected to receive the signal indicative of the voltage drop in the positive and negative input lines 102, 104, compare the sensed voltage drop to the reference voltage 114 at the comparator A1, A2 input terminal, and output a respective fault trigger signal if the sensed voltage drop is less than the reference voltage 114 in the positive line 102, or if the sensed voltage drop is greater than the reference voltage 114 in the negative line 104.

One or more logic gates A3, A5, and A6 can be operatively connected to receive the respective fault trigger signal and output a respective gate signal to a flip-flop A4. In embodiments, such as shown, the at least one logic gate can include the flip-flop A4 (e.g., an RS flip-flop), a first NOT gate A5 disposed in the positive line 102 configured to invert the output logic from comparator A1 in the positive input line 102, an OR gate A3 configured to OR the respective fault trigger signals and output the ORed signal to an R and S input of the flip-flop A4, and a second NOT gate A6 disposed between the OR gate A3 and the flip-flop A4 configured to invert the ORed signal at the R input of the flip-flop A4.

If the output of the flip-flop A4 is HIGH, the fault trigger signal 118 is then fed to the control module 128. The control module 120 can control the contactor block 124 to move the one or more contactors W1 to W3 to the open state to disconnect the voltage input 106 from the load 108 (e.g., the contactors will be on an OFF position, disconnecting the rectifier section 122 form three phase supply). If the output of the flip-flop A4 is LOW, no fault detection trigger is stored in the flip-flop A4 or fed to the control module 120, because no fault has been detected. Here, the one or more contactors W1 to W3 in the contactor block 124 remain in the closed state (e.g., where power remains connected to the rectifier 122).

For example, under normal operation the comparator A1 output is logic HIGH and this signal is fed to inverting gate A5, then to OR gate A3 and A4, where resultant output logic for the flip-flop A4 LOW. But, if a short circuit occurred in upper side of the rectifier diode section, such as D1 for example, then comparator A1 non-inverting input voltage will be less than the reference voltage 114 and the comparator A1 output will be LOW. This signal is then feed to inverting NOT gate A5, and then to OR gate A3 and, finally to SR flip-flop A4. The output logic at the flip-flop A4 will be HIGH, which will signal the control module 12 to move the contactors W1 to W3 to the open (OFF) state disconnecting the rectifier 122 from the power supply 106.

In embodiments, the sensing network 116 can also include, one or more protection diodes D19, D21, D22, operatively connected between each of the positive and negative lines 102, 104 and ground, to protect the downstream electronics, such as the one or more logic gates A1 to A6, for example. In certain embodiments, the one or more protection diodes D19, D21, D22 include at least one of a Zener diode (e.g., D19, D22) and/or a Schottky diode (e.g., D21). The Schottkey diode can be configured to clamp a level shifted negative peak in the positive input line during a fault if a sensed voltage in the positive line drops to 0V, and the Zener diode can be configured to clamp a maximum voltage of an input of the one or more comparators A1 to A6.

Turning to FIG. 2, a system 200 can be similar to that of system 100, for example system 200 can have similar components and features with respect to system 100. For brevity, the description of common elements that have been described above for system 100 are not repeated with respect to system 200 as shown in FIG. 2.

In system 200, the rectifier 222 can be a full bridge reciter disposed between the voltage input 106 and the logic module 110. The rectifier 222 can include one or more rectifier diode pairs D1 to D12 for one or more phases, where the rectifier diodes arranged in series to form the respective diode pair. Here, one diode pair can be included for each phase, each diode pair configured to rectify the voltage input from AC to DC. As shown, the system 200 can include three diode pairs, one for each of the three phases A, B, C. In certain applications, redundancy may be desired, therefore, in system 200, if anyone diode in a pair of diodes is shorted or damaged, the remaining undamaged diode of the pair is able to continue to function and provide rectification the AC voltage.

Also in system 200, one or more fault detection diodes D13, to D18 in block 228 can be disposed between the rectifier 222 and the logic module 110, configured to detect a fault in any one of the one or more rectifier diodes D1 to D12, while the logic module 110 is still configured the same, or similar to system 100. In system 200, the sensing network 116 can be disposed between the one or more fault detection diodes 228 and the input 126 of the logic module 110.

For example, in the normal operating conditions, the sense diode D13 will conduct sine negative peak and pass through the voltage sensing network and current sense R1, R2 and R5. The voltage bias input can then provide level shifting of the negative peak signal in order to fit to the comparator operating threshold. But if there is a short circuit in the lower side of the rectifier diode section, such as in D8, the sensing diode D18 will conduct a sine positive peak and pass through the voltage to the sensing network and current sense resistors R3 and R4. Then the comparator A2 non-inverting input voltage will be greater than the reference voltage and output logic will be HIGH. This signal is then feed to OR gate A3 and to flip-flop A4. The resultant output logic at the flip-flop A4 is HIGH, which will signal the control module to move the contactors to the open (OFF) state disconnecting the rectifier from the power supply.

In certain embodiments, a downstream converter 130 can be disposed between the rectifier 122, 222 and the load 108, such as AC/DC convertor or a DC/DC convertor, or any suitable combination of the two.

In accordance with at least one aspect of this disclosure, a method can include detecting a fault in one or more of a positive input line and/or a negative input line (e.g., lines 102 and 104) using one or more current sense resistors (e.g., R1 to R4), outputting a fault trigger signal (e.g., signal 118) to a control module (e.g., module 120), and controlling, with the control module, a contactor block (e.g., block 124). As described above with respect to system 100, the contactor block can be disposed between a voltage input and a load to disconnect the voltage input from the positive input line and negative input line based at least in part on the fault trigger signal.

In embodiments, detecting can include at least one of sensing a voltage drop across each of the positive input line and the negative input line at an input of a logic module and outputting a signal indicative of the voltage drop in each of the positive and negative input lines, and/or comparing the signal indicative of the voltage drop in each of the positive and negative input lines to a reference voltage (e.g., a reference voltage at comparator inverting input terminal) and outputting a respective fault trigger signal for each of the positive and negative input lines if the sensed voltage drop is greater than the reference voltage.

In embodiments, detecting can further include at least one of: inverting the respective fault trigger signal from the positive input line, ORing the respective fault trigger signals from each of the positive and negative lines and outputting the ORed signal to an R and S input of a flip-flop (e.g., A4), and/or, inverting the ORed signal at the R input of the flip-flop.

Outputting can include, outputting the fault trigger signal from the flip-flop to the control module, where if the output of the flip-flop is HIGH, controlling, with the control module, the contactor block to move one or more contactors to the open state to disconnect the voltage input from the load and if the output of the flip-flop is LOW, controlling the contactor block, with the control module, to retain one or more contactors in the closed state to maintain electrical connection between the voltage input and the load. In embodiments, the method can also include, inverting a voltage from the positive input line if a fault has occurred using a voltage bias input operatively connected to the positive input line.

In typical fault detection system, if one of the electrical branches has a short, the frequency of the output provided by fault tolerant rectifier drops to two times the frequency of any individual AC voltage provided by any of AC voltage sources. This needs then needs a frequency counter and detection mechanism. Certain fault detection systems may utilize the spectrum analyzing unit, having for example, an analog-to-digital (AD) converter, a spectrum calculator, and a frequency selector. However, this kind of topology brings complexity to the unit and added cost. Moreover, rectified AC signals include harmonics, where distortion can make faults more difficult to predict. For example, the distortion can shift the frequency of sinewave perceived by the frequency selector causing false positive fault detection.

Embodiments of the systems and methods disclosed herein provide for a short circuit detection circuit and short circuit detection method, and in particular, a short circuit detection circuit and a short circuit detection method for a multiphase rectifier included in an alternator or Integrated Starter Generator (ISG) application, improved relative to the conventional fault detection methods and systems.

The apparatus, systems, and associated methods as disclosed herein relate to AC rectifiers, and embodiments of the apparatus, systems, and associated methods, can allow for fault tolerant AC rectification without the using current limiting resistors. Additionally, this allows for a more ideal output signal for sensitive electronics and/or sensors. The disclosure, while described relating to a three-phase system, is not limited to three phase system and can be utilized for any number of phases (e.g., a one-phase system) as well, while topology remains the be same.

Embodiments as disclosed herein can include few hardware components than traditional systems, making it is easier to implement and easier to detect the faults and isolate the power source from the rectifier. Embodiments can be more cost effective while compared to utilization of spectrum analyzer or frequency counters.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A fault detection system, comprising:
   a positive input line configured to connect between a voltage input and a load;
   a negative input line configured to connect between the voltage input and the load;
   a logic module configured to detect a fault in either of the positive input line or the negative input line between the voltage input and the load, the logic module including:
   a voltage bias input operatively connected to the positive input line configured to invert voltage from the positive input line if the fault has occurred; and
   a sensing network configured to sense a voltage of the positive input line and the negative input line at an input of the logic module, wherein the sensing network is configured to output a fault trigger to a control module to disconnect the voltage input from the positive input line and the negative input line if the fault is detected;
   a rectifier disposed between the voltage input and the logic module; and
   a contactor block disposed between the voltage input and the rectifier and operatively connected to the control module, the contactor block comprising one or more contactors for one or more phases, wherein one contactor is included for each phase.

2. The system as recited in claim 1, wherein the rectifier includes one or more rectifier diodes for the one or more phases, wherein one rectifier diode is included for each phase, the one or more rectifier diodes configured to rectify the voltage input from AC to DC.

3. The system as recited in claim 2, wherein the one or more rectifier diodes include three rectifier diodes, and wherein the one or more phases include three phases such that the system is configured for use with a three-phase rectifier.

4. The system as recited in claim 2, wherein each contactor of the contactor block is configured to move between an open state and a closed state, and wherein the control module is configured to control each respective contactor to move to the open state if the fault has occurred.

5. The system as recited in claim 4, wherein the sensing network is disposed at an input of the logic module.

6. The system as recited in claim 5, wherein the sensing network includes:
   one or more current sense resistors disposed in each of the positive input line and the negative input line configured to sense a voltage drop across each of the positive input line and the negative input line at the input of the logic module and operative to output a signal indicative of the sensed voltage drop in each of the positive input line and the negative input line;

multiple comparators operatively connected to receive the signal indicative of the voltage drop in the positive input line and the negative input line, compare the sensed voltage drop to a reference voltage, and output respective fault trigger signals if the sensed voltage drop in the positive input line or the negative input line is greater than the reference voltage; and one or more logic gates operatively connected to receive the respective fault trigger signals and output a respective gate signal to a flip-flop.

7. The system as recited in claim 6, wherein the one or more logic gates include:
the flip-flop, wherein the flip-flop includes an RS flip-flop;
a first NOT gate disposed in the positive input line configured to invert the respective fault trigger signal from the positive input line;
an OR gate configured to OR the respective fault trigger signals and output an ORed signal to an R input and an S input of the flip-flop; and
a second NOT gate disposed between the OR gate and the flip-flop configured to invert the ORed signal at the R input of the flip-flop.

8. The system as recited in claim 6, wherein the sensing network further includes one or more protection diodes operatively connected between each of the positive input line and the negative input line and ground.

9. The system as recited in claim 8, wherein the one or more protection diodes include at least one of a Zener diode or a Schottky diode.

10. The system as recited in claim 9, wherein the Schottky diode is configured to clamp a negative peak in the positive input line during the fault if a sensed voltage in the positive input line drops to 0V, and wherein the Zener diode is configured to clamp a maximum voltage of an input of the one or more comparators.

11. The system as recited in claim 7, wherein, if the output of the flip-flop is HIGH, the fault trigger signal is fed to the control module to control the contactor block to move the one or more contactors to the open state to disconnect the voltage input from the load.

12. The system as recited in claim 7, wherein, if the output of the flip-flop is LOW, no fault detection trigger is stored in the flip-flop or fed to the control module such that the one or more contactors in the contactor block remain in the closed state.

13. The system as recited in claim 7, wherein the rectifier is a full bridge rectifier disposed between the voltage input and the logic module, the full bridge rectifier including one or more rectifier diode pairs for one or more phases, arranged in series, wherein one diode pair is included for each phase, each diode pair configured to rectify the voltage input from AC to DC.

14. The system as recited in claim 13, further comprising one or more fault detection diodes disposed between the full bridge rectifier and the logic module configured to detect the fault in any one of the one or more rectifier diodes.

15. The system as recited in claim 14, wherein the sensing network is disposed between the one or more fault detection diodes and the logic module.

16. A method for fault detection, comprising:
detecting a fault in one or more of a positive input line or a negative input line using one or more current sense resistors, wherein:
the positive input line is configured to connect between a voltage input and a load;
the negative input line is configured to connect between the voltage input and the load; and
a logic module is configured to detect the fault in either of the positive input line or the negative input line between the voltage input and the load, the logic module including:
a voltage bias input operatively connected to the positive input line configured to invert voltage from the positive input line if the fault has occurred; and
a sensing network configured to sense a voltage of the positive input line and the negative input line at an input of the logic module;
outputting a fault trigger signal to a control module, using the sensing network, to disconnect the voltage input from the positive input line and the negative input line if the fault is detected; and
controlling, with the control module, a contactor block disposed between the voltage input and the load to disconnect the voltage input from the positive input line and the negative input line based at least in part on the fault trigger signal by disconnecting a rectifier disposed between the contactor block and the load, the contactor block comprising one or more contactors for one or more phases, wherein one contactor is included for each phase.

17. The method as recited in claim 16, wherein detecting the fault includes at least one of:
sensing a voltage drop across each of the positive input line and the negative input line at an input of the logic module and outputting a signal indicative of the voltage drop in each of the positive input line and the negative input line; or
comparing the signal indicative of the voltage drop in each of the positive input line and the negative input line to a reference voltage and outputting a respective fault trigger signal for each of the positive input line and the negative input line if the sensed voltage drop is greater than the reference voltage.

18. The method as recited in claim 17, wherein detecting the fault further includes:
inverting the respective fault trigger signal from the positive input line;
ORing the respective fault trigger signals from each of the positive input line and the negative input line and outputting an ORed signal to an R input and an S input of a flip-flop; and
inverting the ORed signal at the R input of the flip-flop.

19. The method as recited in claim 18, wherein outputting the fault trigger signal includes outputting the fault trigger signal from the flip-flop to the control module.

20. The method as recited in claim 19, wherein controlling the contactor block includes:
if an output of the flip-flop is HIGH, controlling, with the control module, the contactor block to move the one or more contactors to an open state to disconnect the voltage input from the load; and
if the output of the flip-flop is LOW, controlling, with the control module, the contactor block to retain the one or more contactors in a closed state to maintain electrical connection between the voltage input and the load.

* * * * *